US012742843B2

(12) United States Patent
Shibuya et al.

(10) Patent No.: US 12,742,843 B2
(45) Date of Patent: Sep. 22, 2026

(54) SUPERCONDUCTING MAGNET AND MRI APPARATUS

(71) Applicant: CANON KABUSHIKI KAISHA, Tokyo (JP)

(72) Inventors: Takehiro Shibuya, Nasushiobara (JP); Hiromi Kawamoto, Yaita (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 193 days.

(21) Appl. No.: 18/796,780

(22) Filed: Aug. 7, 2024

(65) Prior Publication Data

US 2025/0060435 A1 Feb. 20, 2025

(30) Foreign Application Priority Data

Aug. 14, 2023 (JP) ................................ 2023-131975

(51) Int. Cl.

| | |
|---|---|
| ***G01V 3/00*** | (2006.01) |
| ***G01R 33/38*** | (2006.01) |
| ***G01R 33/3815*** | (2006.01) |
| ***G01R 33/3875*** | (2006.01) |

(52) U.S. Cl.

CPC ..... *G01R 33/3815* (2013.01); *G01R 33/3804* (2013.01); *G01R 33/3875* (2013.01)

(58) Field of Classification Search

CPC ............ G01R 33/3815; G01R 33/3804; G01R 33/3875

USPC .......................................................... 324/318

See application file for complete search history.

(56) References Cited

U.S. PATENT DOCUMENTS

2020/0185136 A1* 6/2020 Guenter ............ G01R 33/3875

FOREIGN PATENT DOCUMENTS

CN 106990373 B * 7/2019 ......... G01R 33/3642
JP 2021-136300 A 9/2021

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

In one embodiment, a superconducting magnet includes: at least one primary superconducting coil configured to generate a primary magnetic field; at least one secondary superconducting coil configured to generate a secondary magnetic field in a direction opposite to a direction of the primary magnetic field; and a superconducting shim coil configured to surround part or all of an outer surface of at least one of the at least one primary superconducting coil and the at least one secondary superconducting coil and corrects distribution of a static magnetic field generated by both the at least one primary superconducting coil and the at least one secondary superconducting coil.

12 Claims, 11 Drawing Sheets

FIG. 10

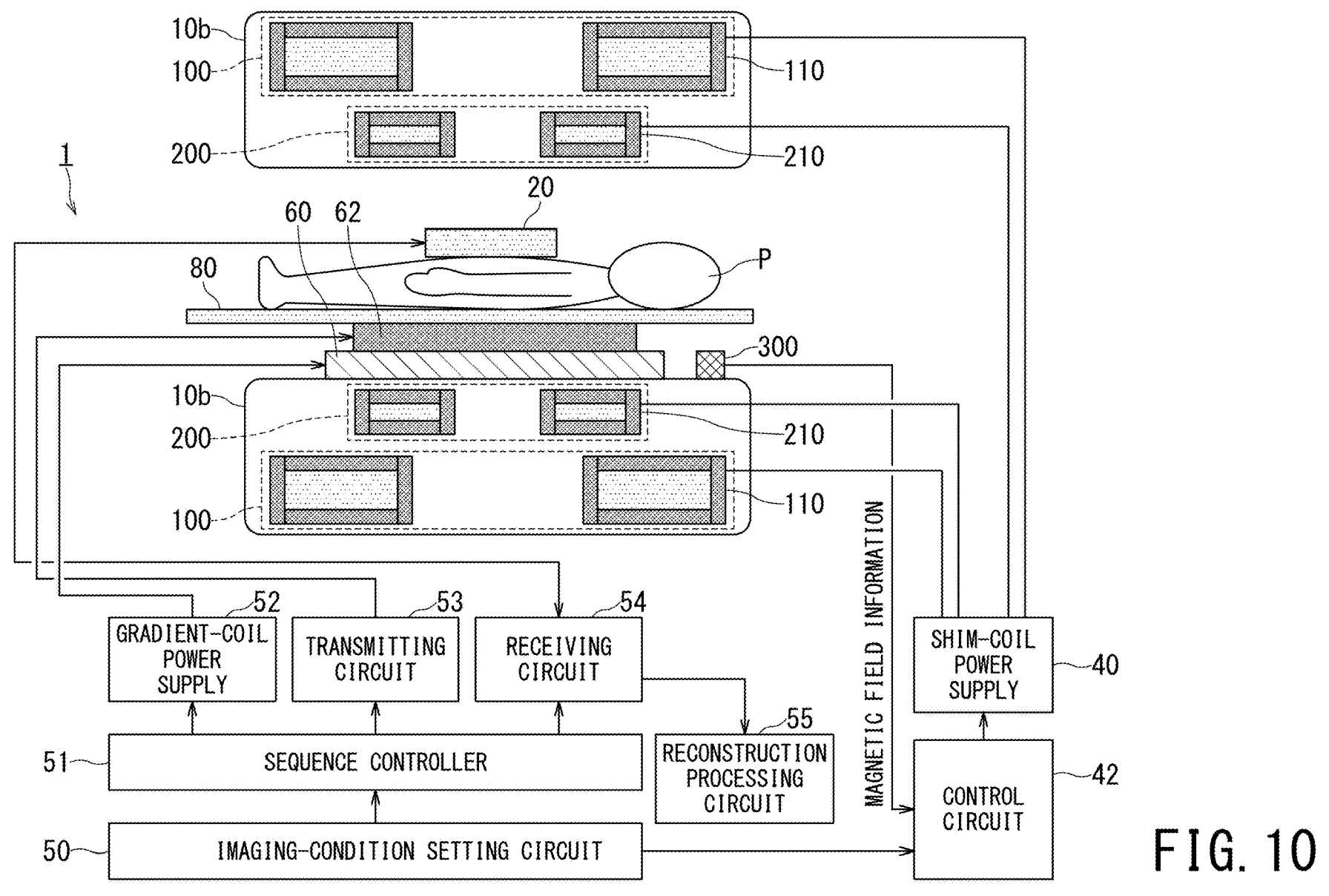

SHIM-COIL POWER SUPPLY
CONTROL CIRCUIT
MAGNETIC FIELD INFORMATION
RECONSTRUCTION PROCESSING CIRCUIT
RECEIVING CIRCUIT
TRANSMITTING CIRCUIT
GRADIENT-COIL POWER SUPPLY
SEQUENCE CONTROLLER
IMAGING-CONDITION SETTING CIRCUIT

SUPERCONDUCTING MAGNET AND MRI APPARATUS

CROSS-REFERENCE TO RELATED APPLICATION

This application is based upon and claims the benefit of priority from Japanese Patent Application No. 2023-131975, filed on Aug. 14, 2023, the entire contents of which are incorporated herein by reference.

TECHNICAL FIELD

Disclosed embodiments relate to a superconducting magnet and a magnetic resonance imaging (MRI) apparatus.

BACKGROUND

An MRI apparatus is an imaging apparatus that magnetically excites nuclear spin of an object placed in a static magnetic field by applying a radio frequency (RF) signal having the Larmor frequency, and reconstructs an image on the basis of magnetic resonance (MR) signals emitted from the object due to the excitation.

Many MRI apparatuses have a configuration called a gantry in which a cylindrical space is formed. Imaging of an object (for example, a patient) lying on a table is performed in a state where the table is moved into the cylindrical space. Inside the gantry, a cylindrical superconducting magnet, a cylindrical gradient coil, and a cylindrical transmitting/receiving coil (i.e., WB (Whole Body) coil) are housed. Since the superconducting magnet, the gradient coil, and the transmitting/receiving coil are cylindrical, this structure adopted in many conventional MRI apparatuses is hereinafter referred to as a cylindrical MRI apparatus.

In the cylindrical MRI apparatus, imaging is performed in the cylindrical closed space, and thus, imaging may be difficult for some patients having claustrophobia, for example.

Accordingly, magnetic resonance imaging systems have been proposed and developed in a different manner that the superconducting magnets and gradient field coils respectively have a planar-shaped structure, and are configured to image a subject such as a patient in an open space between two planar superconducting magnets, for example. Hereinafter, an MRI apparatus having this type of structure is referred to as a planar open type MRI apparatus or simply referred to as an open type MRI apparatus. In the open type MRI apparatus, imaging is performed in the open space, and thus, even patients having claustrophobia can be imaged.

In both the cylindrical MRI apparatus and the open type MRI apparatus, high winding accuracy of the superconducting coils constituting each superconducting magnet is required, so as to achieve the desired static magnetic field distribution.

The winding position of the superconducting coil may be slightly deviated or misaligned due to various factors such as manufacturing errors and/or thermal deformation. Such misalignment of the winding wire may cause undesirable change in distribution of the static magnetic field generated by the superconducting magnet.

BRIEF DESCRIPTION OF THE DRAWINGS

In the accompanying drawings:

FIG. 10 is a block diagram illustrating a configuration of the MRI apparatus according to the embodiment.

DETAILED DESCRIPTION

Hereinbelow, embodiments of the present invention will be described by referring to the accompanying drawings.

In one embodiment, a superconducting magnet includes: at least one primary superconducting coil configured to generate a primary magnetic field; at least one secondary superconducting coil configured to generate a secondary magnetic field in a direction opposite to a direction of the primary magnetic field; and a superconducting shim coil configured to surround part or all of an outer surface of at least one of the at least one primary superconducting coil and the at least one secondary superconducting coil and corrects distribution of a static magnetic field generated by both the at least one primary superconducting coil and the at least one secondary superconducting coil.

(Superconducting Magnet)

Figure 1:
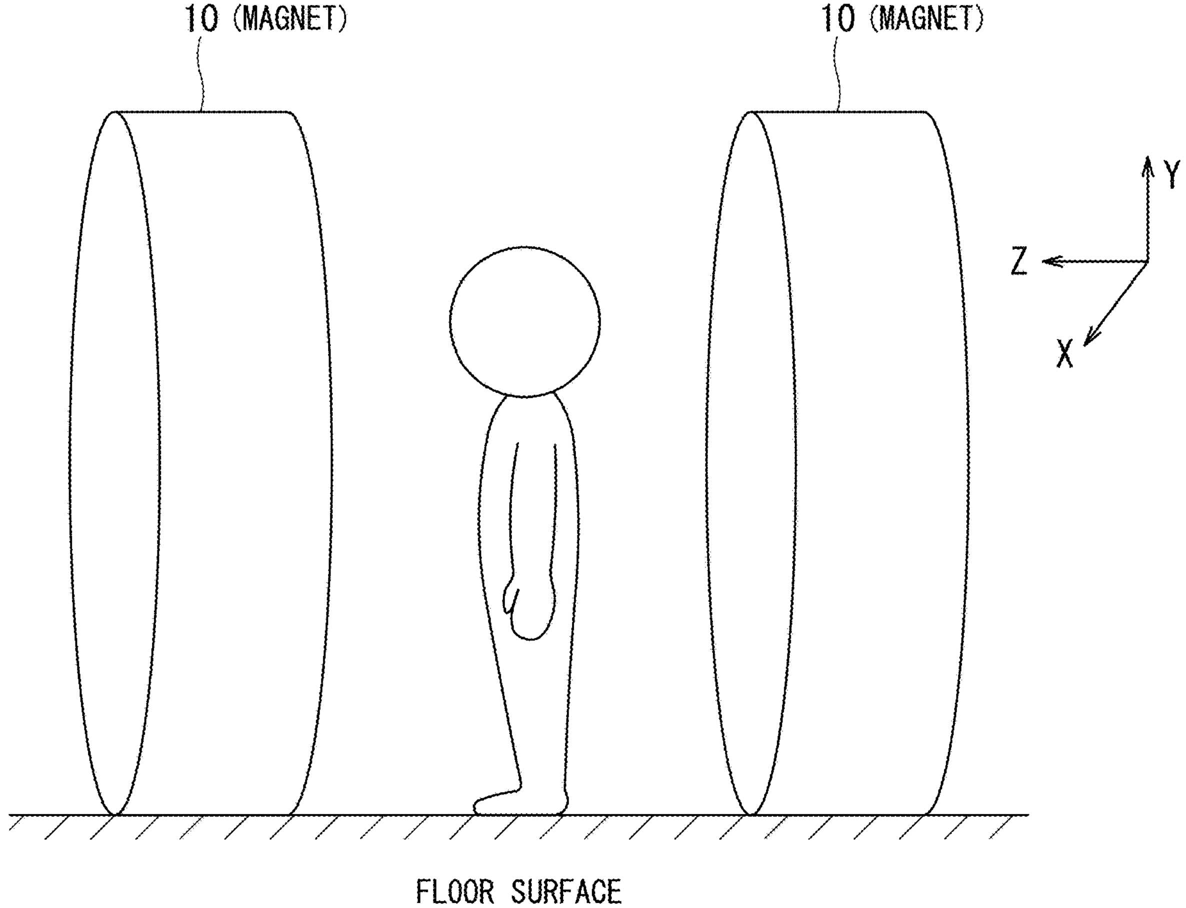
FIG. 1 is a schematic diagram illustrating a first configuration of superconducting magnets in an MRI apparatus according to one embodiment.

FIG. 1 is a schematic diagram illustrating a first arrangement of superconducting magnets 10 that are used in an open type MRI apparatus 1 according to one embodiment. As illustrated in FIG. 1, the MRI apparatus 1 includes two superconducting magnets 10, each of which has a circular planar shape (i.e., a thin cylindrical shape), for example.

Each superconducting magnet 10 is arranged such that the central axis, i.e., the axis passing through the centers of both circular end faces of the cylindrical shape is parallel to the floor surface, for example. Further, the two superconducting magnets 10 are arranged so as to sandwich the object. Such an arrangement of the superconducting magnets 10 generates a magnetic field in the open space between the two superconducting magnets 10. The object is imaged in this open space in a standing position, for example.

Figure 2:
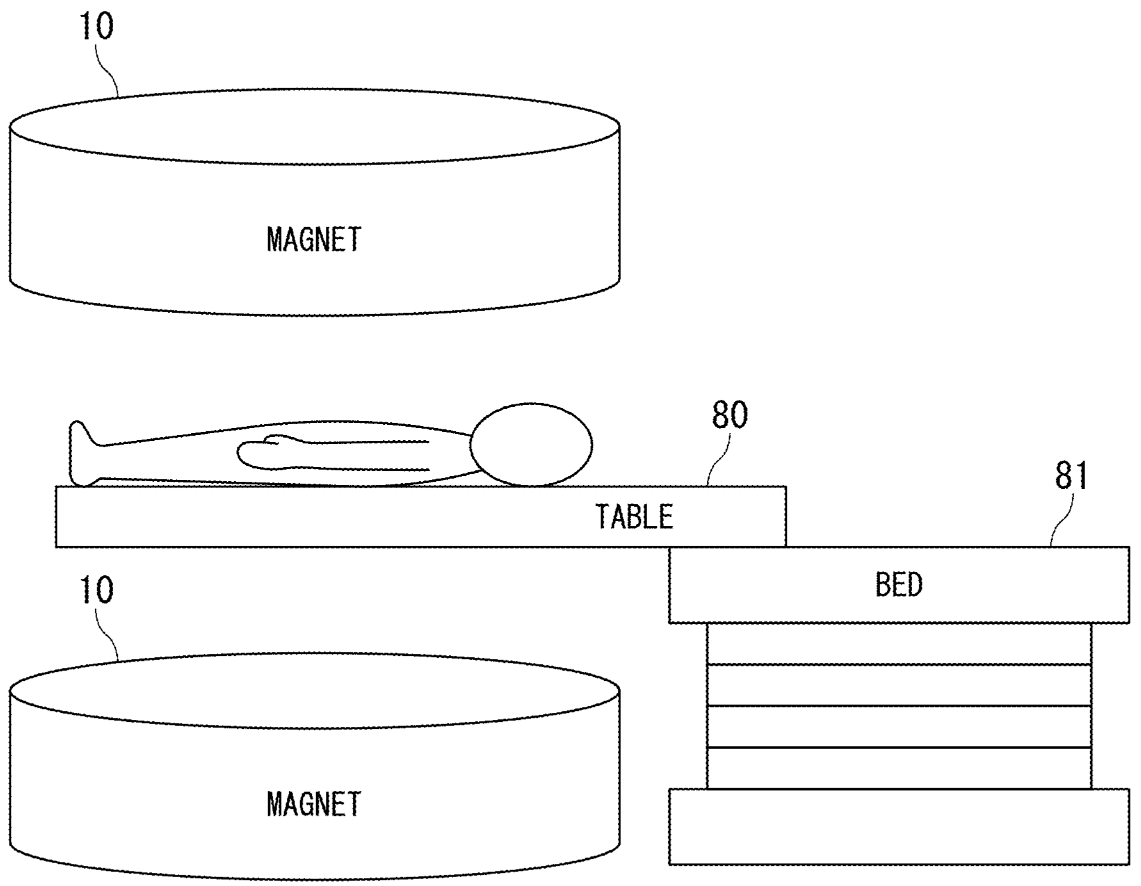
FIG. 2 is a schematic diagram illustrating a second configuration of the superconducting magnets in the MRI apparatus according to the embodiment.

FIG. 2 is a schematic diagram illustrating a second arrangement of the superconducting magnets 10 that are used in the open type MRI apparatus 1. While FIG. 1 illustrates an arrangement for imaging an object in a standing position, FIG. 2 illustrates an arrangement for imaging an object in a recumbent position lying on the table 80 of the bed 81. When the object in the recumbent position is imaged, the two superconducting magnets 10 are arranged such that their central axes are in the vertical direction as shown in FIG. 2. For example, one of the superconducting magnets 10 is disposed below the table 51 and the other of the superconducting magnets 10 is disposed above the table 51.

As shown in FIG. 1 and FIG. 2, in the imaging using the superconducting magnets 10 of the embodiment, the object can be imaged in an open magnetic field space, and thus, even a patient with claustrophobia can be imaged, for example.

Although FIG. 1 and FIG. 2 illustrate a case where the whole object is imaged in an open region outside the superconducting magnets 10 containing superconducting coils, it can be part of the object placed in the open region outside the superconducting coils and be imaged.

Figure 3:
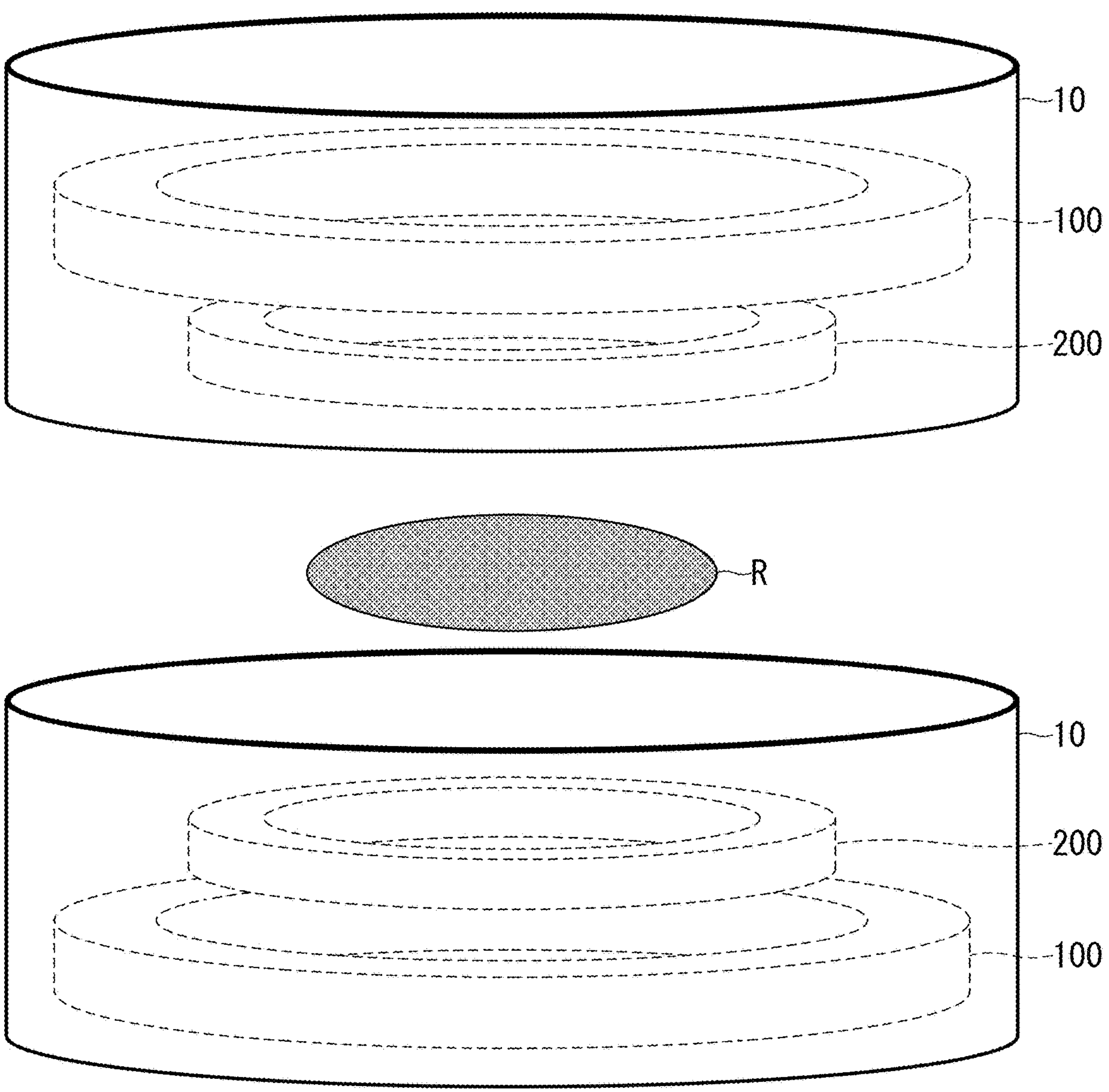
FIG. 3 is a schematic diagram illustrating an internal configuration of the superconducting magnets according to the embodiment.

FIG. 3 illustrates an internal configuration of both superconducting magnets 10 according to the embodiment. Each superconducting magnet 10 includes a primary superconducting coil 100 configured to generate a primary magnetic field and a secondary superconducting coil 200 configured to generate a secondary magnetic field. An electric current flows through the secondary superconducting coil 200 in the direction opposite to the electric current flowing through the primary superconducting coil 100 such that the secondary magnetic field is generated in the direction opposite to the direction of the primary magnetic field.

Hereinafter, the primary superconducting coil 100 may be referred to as the primary coil 100 and the secondary superconducting coil 200 is referred to as the secondary coil 200, as appropriate. Alternatively, since the secondary magnetic field generated by the secondary superconducting coil 200 works in the direction of canceling the primary magnetic field, the secondary superconducting coil 200 may be referred to as a canceling coil 200 in some case.

Further, each of the superconducting magnets 10 includes a superconducting shim coil 110 described below. The superconducting shim coil 110 is configured to correct a static magnetic field distribution of the combined magnetic field, which is a combination of the primary magnetic field generated by the primary superconducting coil 100 and the secondary magnetic field generated by the secondary superconducting coil 200.

Although FIG. 3 illustrates a case where the number of primary superconducting coils 100 and the number of the secondary superconducting coils 200 in each superconducting magnet 10 are both one, each superconducting magnet 10 may include two or more primary superconducting coils 100 and two or more secondary superconducting coils 200.

In an excitation mode, each of the primary superconducting coil 100 and the secondary superconducting coil 200 generates a static magnetic field by causing an electric current supplied from a static magnetic field power supply (not shown) to flow. Afterward, the static magnetic field power supply is disconnected, and the primary superconducting coil 100 and the secondary superconducting coil 200 then shift to a persistent current mode. Once they shifted to the persistent current mode, each of the primary superconducting coil 100 and the secondary superconducting coil 200 continues to generate a strong static magnetic field for a long time, for example, over one year.

Figures 4A, 4B:
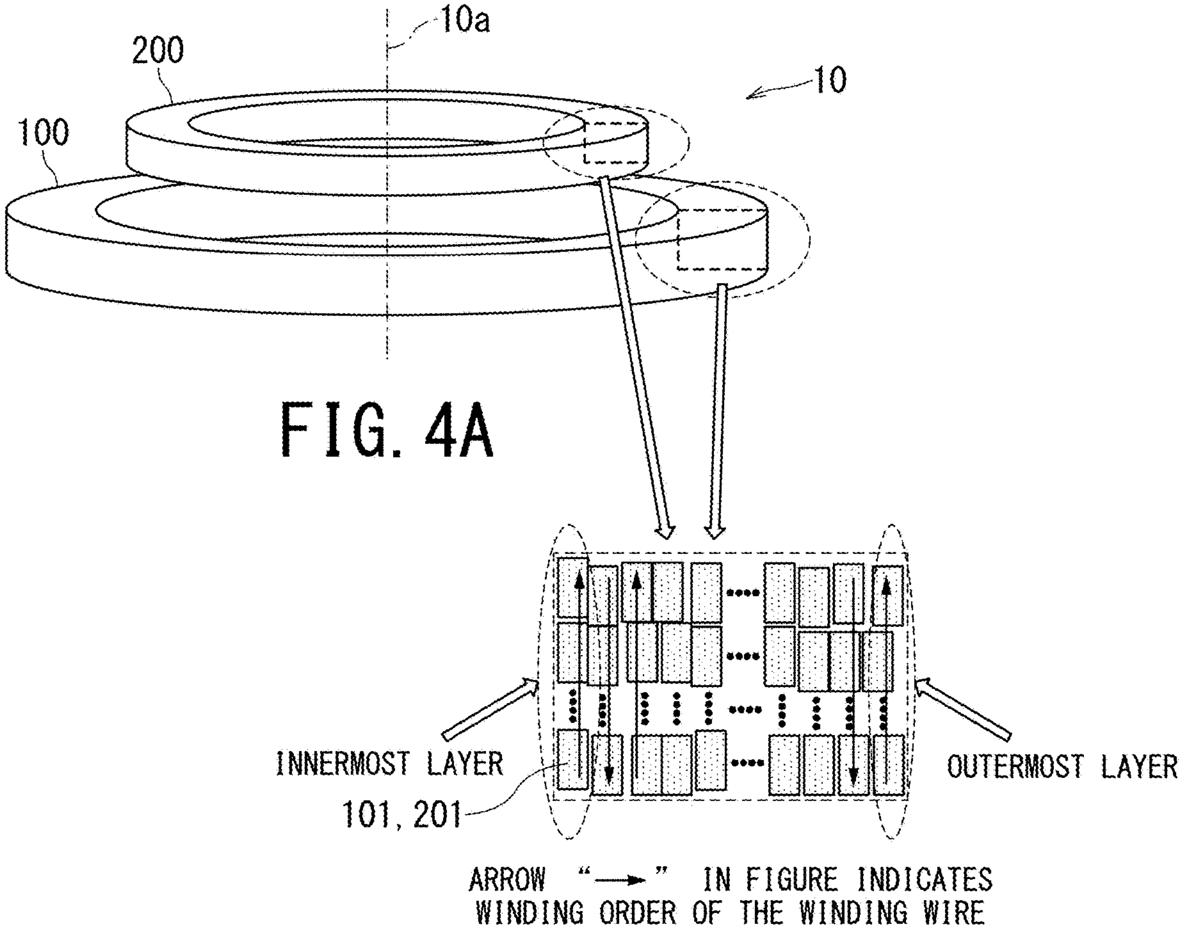
FIG. 4A and FIG. 4B are schematic diagrams illustrating a winding method of a winding wire constituting the superconducting coil.

FIG. 4A and FIG. 4B illustrate a winding method of a winding wire 101 constituting the primary superconducting coil 100 and a winding wire 201 constituting the secondary superconducting coil 200. The primary superconducting coil 100 is configured by winding one winding wire 101 in such a manner that a plurality of cylindrical layers are formed along the direction parallel to the cylindrical axis from its innermost layer toward its outermost layer, for example. Similarly, the secondary superconducting coil 200 is configured by winding one winding wire 201 in such a manner that a plurality of cylindrical layers are formed along the direction parallel to the cylindrical axis from its innermost layer toward its outermost layer, for example. The winding wire 101 and the winding wire 201 differ in diameter of the annular shape and in number of turns, but are substantially the same in terms of winding method. Thus, only the wiring method of the winding wire 101 of the primary superconducting coil 100 will be described below.

In FIG. 4B, a plurality of small hatched rectangles are arranged. Each rectangle represents a cross-section of the one winding wire 101, and the plurality of rectangles represent that the winding wire 101 is coaxially wound a plurality of times around the cylindrical axis 10*a*.

The winding wire 101 can be configured as a structure in which a superconducting wire material such as niobium titanium (Nb—Ti) or a rare earth-based and/or bismuth-based high-temperature superconducting wire material is made into many thin filaments or thin tapes and embedded in a normal-conducting base material such as copper.

Since the winding wire 101 is coaxially wound multiple times, the primary superconducting coil 100 is formed into an annular shape that has a predetermined thickness in the direction parallel to the cylindrical axis 10*a* shown in FIG. 4A and a predetermined width in the direction perpendicular to the cylindrical axis 10*a* (i.e., in the radial direction).

The innermost layer is a layer closest to the cylindrical axis 10*a* in an annular shape. The winding wire 101 is coaxially wound a plurality of times from one end of the innermost layer toward the other end of the innermost layer, for example, from the lower end of the innermost layer to the upper end of the innermost layer. When the winding wire 101 reaches the upper end of the annular shape, it goes downward from the upper end to the lower end of the annular shape to form the second layer. This winding method is repeated from the innermost layer to the outermost layer in the radial direction of the annular shape, and consequently, the entire cross section of the primary superconducting coil 100 is formed to have a predetermined thickness and width.

Usually, in order to avoid problems such as a misalignment of the winding position, the winding wire 101 is wound while being supplied with a viscous material such as resin.

In order to achieve a desired static magnetic field distribution, the winding position and number of turns of the winding wire 101 are determined in advance through calculation and/or simulation. In order to achieve the desired static magnetic field distribution, it is necessary to align the winding position of the winding wire 101 with the predetermined position in an extremely accurate manner.

The following finding has been obtained from simulation conducted by the present inventors. If there is a misalignment of a few tenths of a millimeter between the actual winding position of the winding wire 101 and the predetermined position, the desired static magnetic field distribution may not be achieved, for example.

However, for example, in the manufacturing process in which the winding wire 101 is wound while being applied with a viscous material such as resin, the work of ensuring positional accuracy having misalignment within 0.05 mm is extremely difficult, and thus, misalignments in the winding positions are very likely to occur as manufacturing errors.

Further, since the winding wire 101 wound at a room temperature such as 300K will operate in a superconducting cryogenic environment such as 4K environment, misalignments in the winding positions due to thermal contraction cannot be ignored as well.

As a countermeasure for such a problem, the superconducting magnet 10 of the embodiment includes a superconducting shim coil 110 in addition to the primary superconducting coil 100 and the secondary superconducting coil 200. This superconducting shim coil 110 efficiently corrects errors in the static magnetic field distribution (i.e., deviation from the desired static magnetic field distribution) caused by the misalignments of the winding wire 101 due to factors such as the manufacturing error and/or the thermal contraction.

Hereinbelow, some examples of the superconducting shim coil 110 included in the superconducting magnet 10 will be described by referring to FIG. 5A to FIG. 9B.

The superconducting shim coil 110 is provided so as to surround part or all of the outer surfaces of at least one of the primary superconducting coil 100 and the secondary superconducting coil 200. The superconducting shim coil 110 is configured such that distribution of the static magnetic field generated by the primary superconducting coil 100 and the secondary superconducting coil 200 is corrected by applying a correction current to the superconducting shim coil 110.

The superconducting shim coil 110 may be provided in each of the primary superconducting coil 100 and the secondary superconducting coil 200 or may be provided in either one of the primary superconducting coil 100 and the secondary superconducting coil 200. Although each of the following example is given by having the superconducting shim coil 110 provided in the primary superconducting coil 100, the same applies to the case where the superconducting shim coil 210 is provided in the secondary superconducting coil 200 (see FIG. 10).

Figures 5A, 5B:
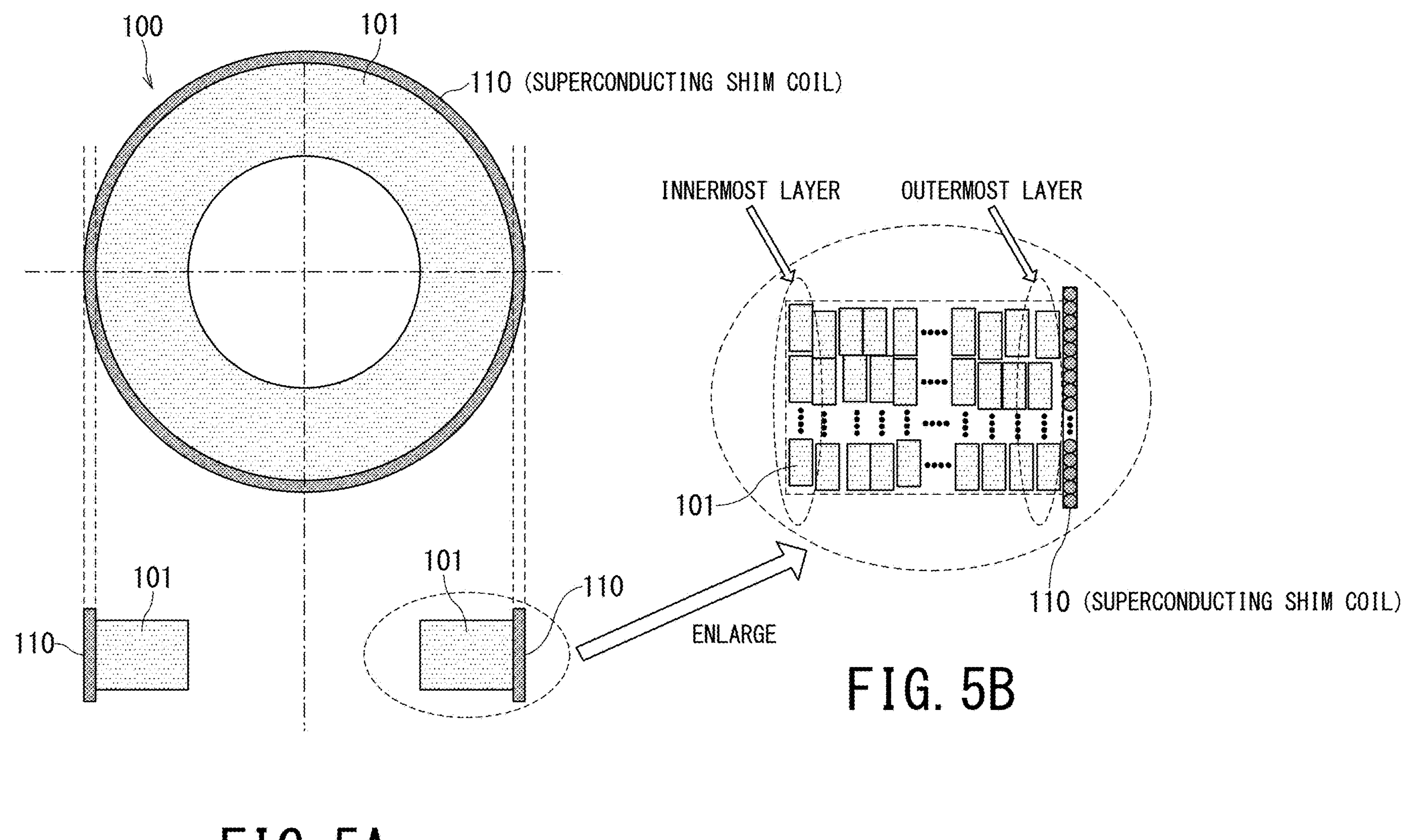
FIG. 5A and FIG. 5B are schematic diagrams illustrating a first example of a superconducting shim coil.

FIG. 5A and FIG. 5B illustrate a first example of the superconducting shim coil. As described above, the winding wire 101 of the primary superconducting coil 100 is wound such that a plurality of layers are formed from the innermost layer toward the outermost layer of its annular shape. Of the outer surfaces of the primary superconducting coil 100, the outermost layer of the winding wire 101 is surrounded by the superconducting shim coil 110, that is, the superconducting shim coil 110 is provided adjacent to the outermost layer in the first example.

It is considered that the misalignment of the winding wire 101 due to factors such as the manufacturing error and/or thermal contraction is larger on the outer circumferential side of the annular shape of the primary superconducting coil 100 than on the inner circumferential side, and that the misalignment at the outermost layer of the winding wire 101 can be the largest. Hence, it is conceivable that the error in the magnetic field due to misalignments can be corrected most efficiently by disposing the superconducting shim coil 110 adjacent to the position where the misalignment is the largest. From this perspective, the superconducting shim coil 110 in the first example is provided adjacent to the outermost layer and a nearby surface of the outer surfaces of the primary superconducting coil 100 so as to surround the outermost layer of the winding wire 101.

Note that the outer surfaces of the primary superconducting coil 100 are composed of a total of four surfaces including: the cylindrical surface adjacent to the innermost layer; the cylindrical surface adjacent to the outermost layer; and two flat planes that are parallel to each other and perpendicular to the cylindrical axis 10*a* and cover the top and bottom of the primary superconducting coil 100.

As shown in FIG. 5B, a winding wire of the superconducting shim coil 110 may be wound and formed into a single-layer solenoid coil or a plurality of layers that surrounds the outermost layer of the winding wire 101 (hereinafter, the winding wire of the superconducting shim coil 110 is abbreviated as "the shim coil wire").

Figures 6A, 6B:
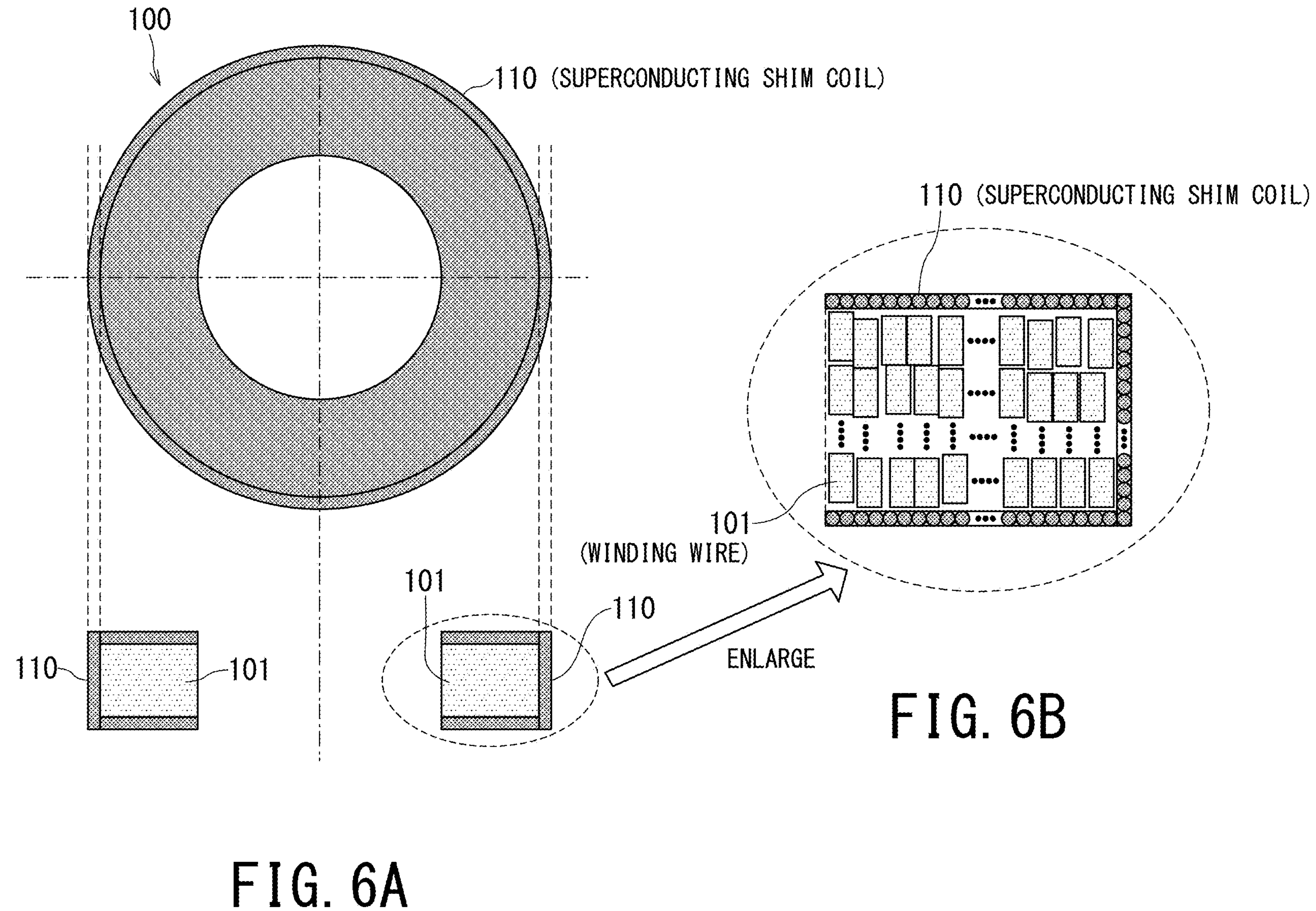
FIG. 6A and FIG. 6B are schematic diagrams illustrating a second example of the superconducting shim coil.

FIG. 6A and FIG. 6B illustrate a second example of the superconducting shim coil 110. In the second example, of the four outer surfaces of the primary superconducting coil 100, in addition to the cylindrical surface adjacent to the outermost layer, two parallel planes perpendicular to the cylindrical axis 10*a* are also surrounded by the superconducting shim coil 110. In other words, the superconducting shim coil 110 of the second example is provided adjacent to three of the four outer surfaces of the primary superconducting coil 100, except the surface facing the innermost layer, so as to surround these three outer surfaces.

The reason of providing the superconducting shim coil 110 adjacent to the two parallel planes is that, next to the cylindrical surface of the outermost layer of the winding wire 101, the misalignment of the winding wire 101 due to factors such as the manufacturing error and the thermal contraction is considered to be the second largest at the position close to the two parallel planes perpendicular to the cylindrical axis 10*a*.

The portion of the superconducting shim coil 110 surrounding the two parallel planes perpendicular to the cylindrical axis 10*a* can be formed by spirally winding, for example.

Aside from the above example, the superconducting shim coil 110 may be configured to surround either one of the two parallel planes perpendicular to the cylindrical axis 10*a*, and the cylindrical surface adjacent to the outermost layer. Alternatively, the superconducting shim coil 110 may be configured to surround only the two parallel planes perpendicular to the cylindrical axis 10*a*. Further alternatively, the superconducting shim coil 110 may be configured to surround at least one of the four surfaces including the two parallel planes perpendicular to the cylindrical axis 10*a*, the cylindrical surface adjacent to the outermost layer of the winding wire 101, and the cylindrical surface adjacent to the innermost layer of the winding wire 101.

Figures 7A, 7B:
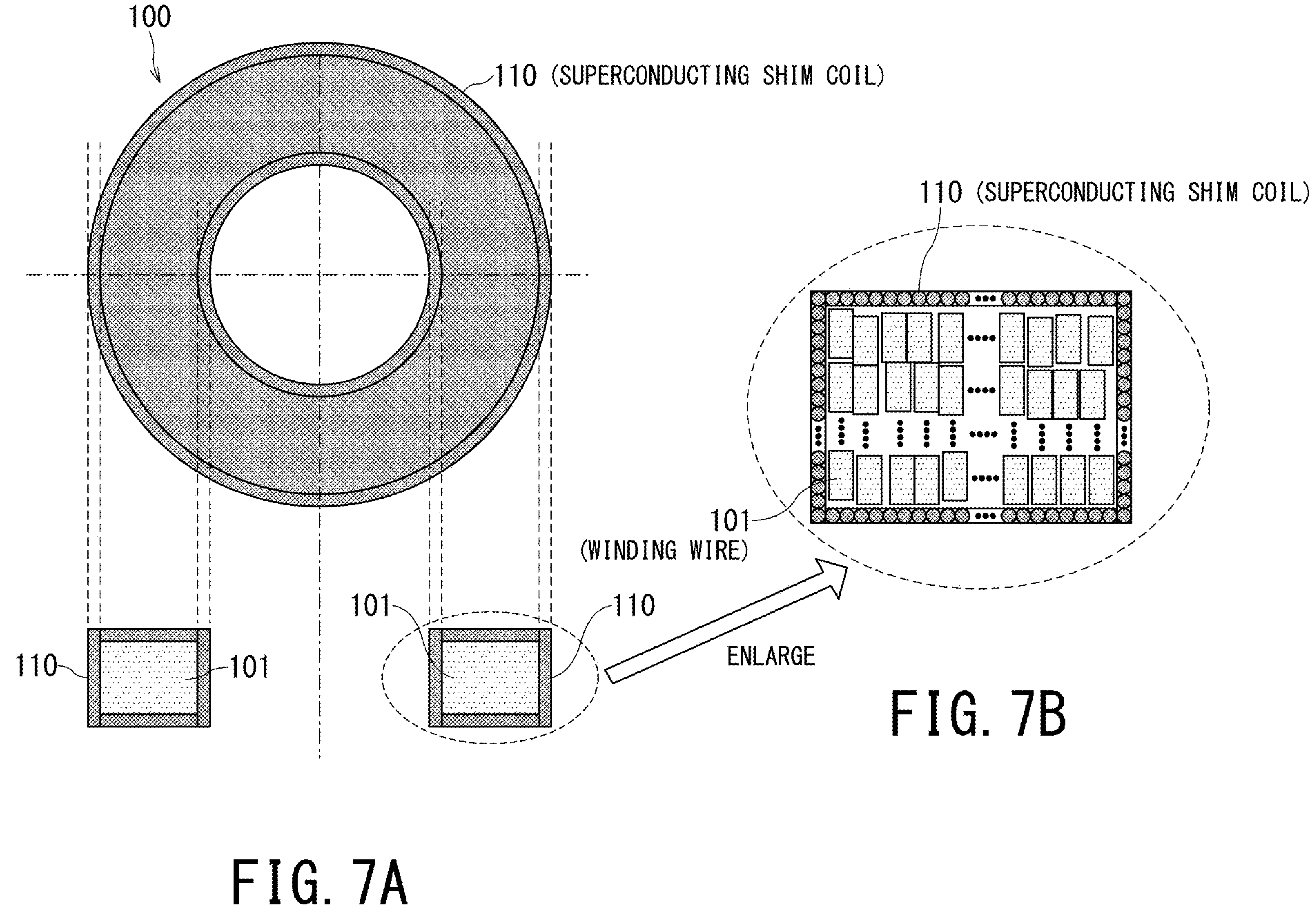
FIG. 7A and FIG. 7B are schematic diagrams illustrating a third example of the superconducting shim coil.

FIG. 7A and FIG. 7B illustrate a third example of the superconducting shim coil 110. The superconducting shim coil 110 of the third example is formed to surround all the four outer surfaces of the primary superconducting coil 100.

Figures 8A, 8B:
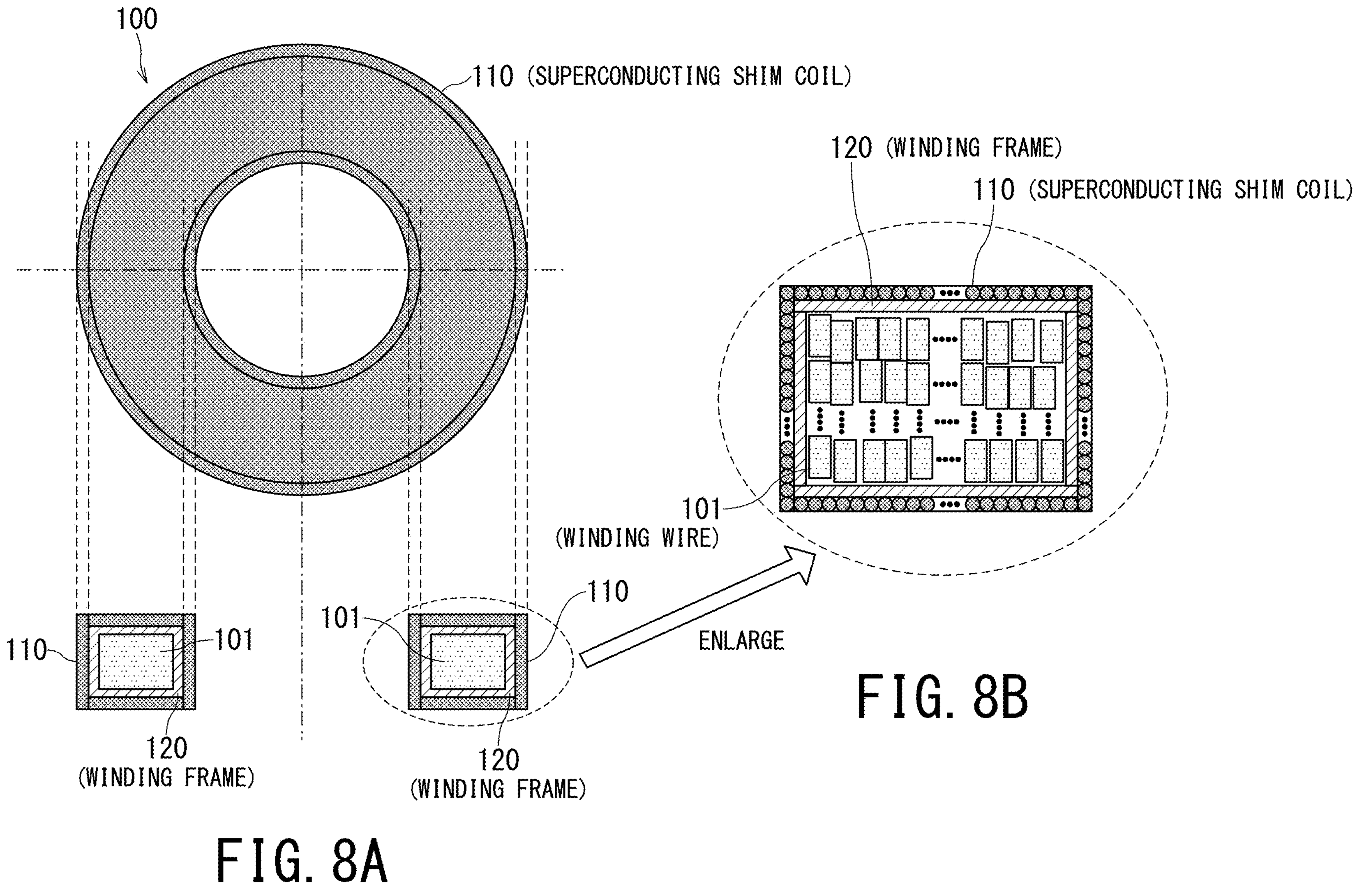
FIG. 8A and FIG. 8B are schematic diagrams illustrating a fourth example of the superconducting shim coil.

FIG. 8A and FIG. 8B illustrate a fourth example of the superconducting shim coil 110. The primary superconducting coil 100 of the fourth example includes a winding frame 120. The winding frame 120 is provided as a guide of the winding wire 101 in order to increase the winding efficiency of the winding wire 101 of the primary superconducting coil 100 or to improve the accuracy of the winding position of the winding wire 101.

As shown in FIG. 8A and FIG. 8B, the winding frame 120 may be provided to surround all the outer surfaces of the winding wire 101, or to surround three of four outer surfaces of the winding wire 101 except the surface near the outermost layer.

In the fourth example, the superconducting shim coil 110 is provided outside the winding frame 120, for example, adjacent to the winding frame 120. In this case, the superconducting shim coil 110 may be provided to surround the entirety of the outer surfaces of the winding frame 120 as shown in FIG. 8A and FIG. 8B. Alternatively, the superconducting shim coil 110 may be provided to surround the surface of the winding frame 120 on the outermost layer side of the winding wire 101 as in the first example. Alternatively, the superconducting shim coil 110 may be provided to surround three surfaces of the winding frame 120 adjacent to the respective three surfaces of the winding wire 101 excluding the surface near the innermost layer, as in the second example.

Figures 9A, 9B:
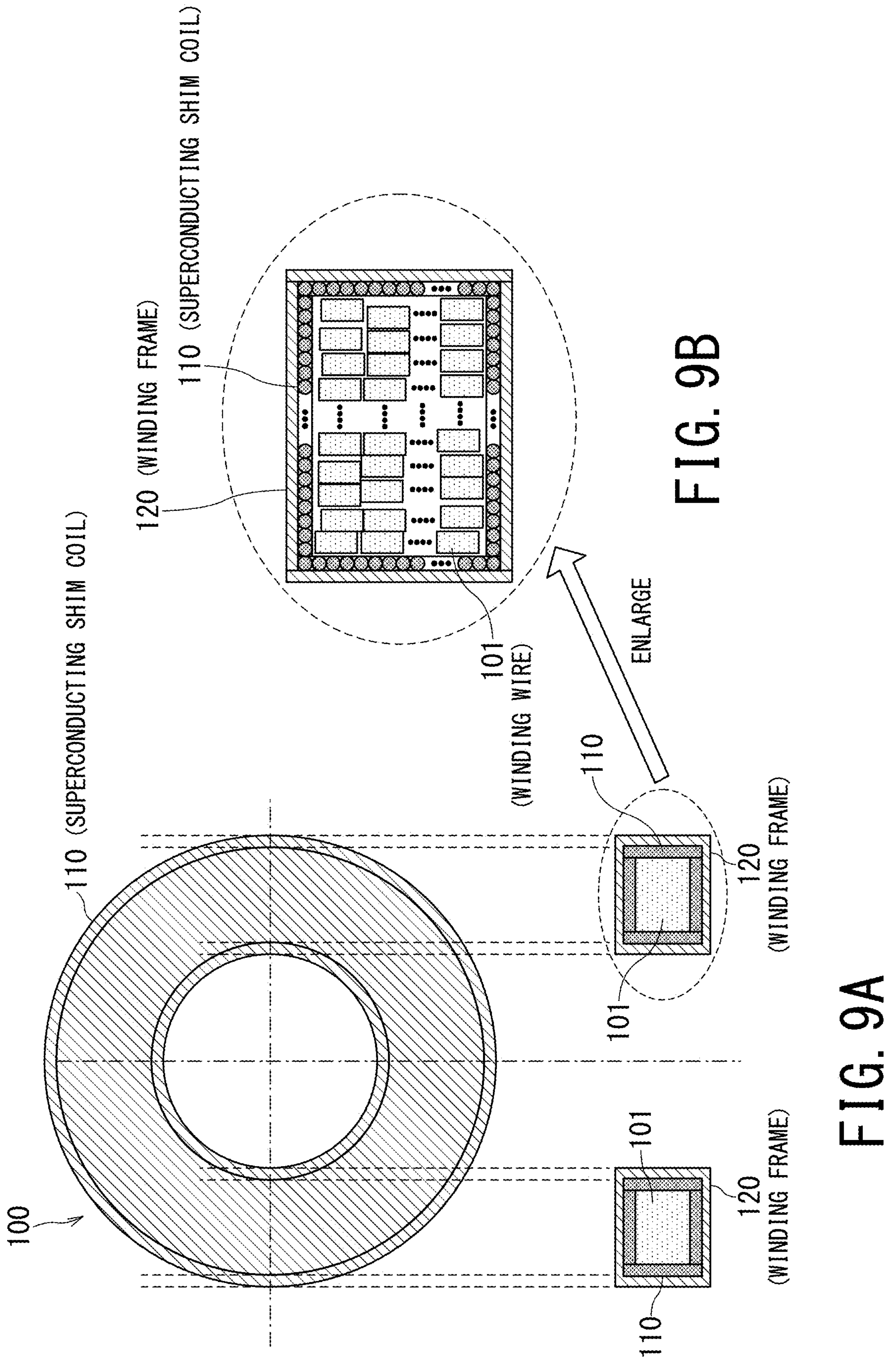
FIG. 9A and FIG. 9B are schematic diagrams illustrating a fifth example of the superconducting shim coil.

FIG. 9A and FIG. 9B illustrate a fifth example of the superconducting shim coil 110. The primary superconducting coil 100 of the fifth example also includes the winding frame 120. The winding frame 120 can be configured to be detachable from the winding wire 101 after winding of the winding wire 101 is completed. In the primary superconducting coil 100 having such a winding frame 120 as shown in FIG. 9A and FIG. 9B, the superconducting shim coil 110 can be provided inside the winding frame 120, i.e., between the winding frame 120 and the winding wire 101. In such a configuration, though the superconducting shim coil 110 may be provided to surround the entirety of the outer surfaces of the winding wire 101 as shown in FIG. 9A and FIG. 9B, the superconducting shim coil 110 may be provided to surround the outermost layer of the winding wire 101, or may be provided to surround the three outer surfaces of the winding wire 101 excluding the surface on the innermost layer side.

(MRI Apparatus)

FIG. 10 is a configuration diagram illustrating the MRI apparatus 1 where both superconducting magnets 10 provided with the primary superconducting coil 100 and the secondary superconducting coil 200 of one of the above examples are arranged on the respective upper and lower sides so as to sandwich the lying object P from above and below. An imaging region or FOV (Field of View) is formed between the two superconducting magnets 10.

The primary superconducting coil 100 provided in each of the two superconducting magnets 10 is provided with the superconducting shim coil 110, and the secondary superconducting coil 200 provided in each of the two superconducting magnets 10 is provided with the superconducting shim coil 210. The superconducting shim coil 110 surrounds the outer surfaces of the winding wire 101 of the primary superconducting coil 100 (hereinafter abbreviated as the primary coil 100), and the superconducting shim coil 210 surrounds the outer surfaces of the winding wire 201 of the secondary superconducting coil 200 (hereinafter abbreviated as the secondary coil 200).

The primary coil 100 and the secondary coil 200, which outer surfaces are respectively surrounded by the superconducting shim coils 110 and 210, are housed in a cooling container 10*b* called a cryostat, for example.

The MRI apparatus 1 shown in FIG. 10 includes a table 80 on which an object P lies, a local coil 20 installed close to the object P, a gradient coil 60, and an RF coil 62 in addition to the two superconducting magnets 10.

The MRI apparatus 1 further includes a magnetic field sensor 300, a shim-coil power supply 40, a control circuit 42, an imaging-condition setting circuit 50, a sequence controller 51, a gradient-coil power supply 52, a transmitting circuit 53, a receiving circuit 54, and a reconstruction processing circuit 55.

The magnetic field sensor 300 is disposed at a predetermined position outside the cooling container 10*b*, and obtains magnetic field information such as the strength of the static magnetic field and the static magnetic field distribution by measurement. Although one magnetic field sensor 300 is shown in FIG. 10, the number of magnetic field sensors 300 may be plural, and these magnetic field sensors 300 are disposed at predetermined positions outside the cooling container 10*b*, for example, at positions adjacent to the imaging space.

The primary superconducting coil 100, the secondary superconducting coil 200, and the superconducting shim coils 110 and 210 are housed in a columnar cooling container 10*b* having two parallel planes, or housed in a cylindrical cooling container 10*b* having a central cavity, for example. In this case, the magnetic field sensor 300 may be provided outside the columnar cooling container or in the central cavity of the cylindrical cooling container, for example.

The imaging-condition setting circuit 50 sets or selects imaging conditions, such as a type of pulse sequence and values of various parameters inputted via a user interface (not shown), on the sequence controller 51.

The sequence controller 51 performs a scan of the object by driving the gradient-coil power supply 52 and the transmitting circuit 53 based on the selected or set imaging conditions.

The gradient-coil power supply 52 applies gradient magnetic field currents to the gradient coil 60 based on a drive signal from the sequence controller 51.

The transmitting circuit 53 generates an RF pulse based on the drive signal from the sequence controller 51, and applies the RF pulse to the RF coil 62. MR (Magnetic Resonance) signals emitted from the object P in response to application of the RF pulse are received by the local coil 20. The MR signals received by the local coil 20 are converted from analog signals into digital signals by the receiving circuit 54. The MR signals converted into the digital signals are inputted as k-space data to the reconstruction processing circuit 55. The reconstruction processing circuit 55 performs reconstruction processing such as inverse Fourier transform on the k-space data to generate a magnetic resonance image.

As described above, the primary coil 100 and the secondary coil 200 are supplied with electric currents supplied from the static magnetic field power supply (not shown) in the excitation mode, and then the primary coil 100 and the secondary coil 200 are disconnected from the static magnetic field power supply and shift to the persistent current mode. After shifting to the persistent current mode, the static magnetic field distribution of the combined magnetic field, which is a combination of the primary magnetic field generated by the primary coil 100 and the secondary magnetic field generated by the secondary coil 200, is maintained.

The outer surfaces of the primary coil 100 are surrounded by the superconducting shim coil 110, and the outer surfaces of the secondary coil 200 are surrounded by the superconducting shim coil 210.

Although the superconducting shim coils 110 and 210 respectively surround all the outer surfaces of the primary coil 100 and the secondary coil 200 in FIG. 10, the superconducting shim coils 110 and 210 may surround one or some of the outer surfaces as described above. Further, although the outer surfaces of both the primary coil 100 and the secondary coil 200 are surrounded by the superconducting shim coils 110 and 210 in FIG. 10, it may be configured such that only one of both, for example, only the primary coil 100 is surrounded by the superconducting shim coil 110.

The superconducting shim coils 110 and 210 are supplied with electric currents from the shim coil power supply 40 under the control of the control circuit 42. On the basis of information on the magnetic field measured by the magnetic field sensor 300, the control circuit 42 determines the electric currents to be applied to the superconducting shim coils 110 and 210 by feedback control so as to correct distribution of the static magnetic field generated by the primary coil 100 and the secondary coil 200, for example. The shim coil power supply 40 applies the electric currents determined by the control circuit 42 to the superconducting shim coils 110 and 210.

The superconducting shim coils 110 and 210 can be configured to be constantly connected to the shim coil power supply 40 and to correct the static magnetic field distribution by the electric currents constantly supplied from the shim coil power supply 40.

It may also be configured such that a persistent current switch (PCS) is provided between the superconducting shim coils 110, 210 and the shim coil power supply 40. In this configuration, the superconducting shim coils 110 and 210 correct the static magnetic field distribution by the electric currents supplied from the shim coil power supply 40 through the persistent current switch before shifting to the persistent current mode, and then shift to the persistent current mode after turning off the persistent current switch. After shifting to the persistent current mode, the static magnetic field distribution corrected immediately before shifting to the persistent current mode is maintained.

As described above, electric currents are applied to the primary coil 100 and the secondary coil 200 such that the direction of the magnetic field generated by the secondary coil 200 is opposite to the direction of the magnetic field generated by the primary coil 100. Thus, when the sign representing the magnetic field generated by the primary coil 100 is positive, the sign representing the magnetic field generated by the secondary coil 200 is negative.

As a result, in the combined magnetic field, the magnetic field generated by the primary coil 100 and the magnetic field generated by the secondary coil 200 cancel each other out, and a region with uniform magnetic field strength (i.e., a region where the magnetic field strength hardly changes) or a magnetic field region having a very gently sloped magnetic field distribution can be generated in the cylindrical axis direction (i.e., the vertical direction in FIG. 2 and FIG. 10). Such a region where the magnetic field strength hardly changes can be set as the FOV during MR imaging.

Meanwhile, as described above, if slight misalignments of the winding position of each winding wire of the primary coil 100 or the secondary coil 200 occur due to factors such as the manufacturing error and the thermal deformation, such misalignments of the winding wire cause disturbance in distribution of the static magnetic field generated by the primary coil 100 or the secondary coil 200. As the gap between the adjacent winding wire increases, the behavior of the magnetic field gradually deviates from the behavior when there is no gap caused by misalignments.

Accordingly, the area having uniform magnetic field strength (i.e. the area that can be used as the FOV during MR imaging), which would exist when there is no gap error, may no longer be available if the gap error occurs.

In the superconducting magnet of the present embodiment, in order to avoid such a situation, the above-described superconducting shim coils 110 and 210 are provided, and disturbance in the static magnetic field distribution due to factors such as the manufacturing error and the thermal deformation is corrected by controlling the electric currents to be applied to the superconducting shim coils 110 and 210. For example, the ideal static magnetic field distribution without manufacturing errors and thermal deformation is stored in advance in an appropriate memory. Then, disturbance in the static magnetic field distribution due to factors such as the manufacturing errors and the thermal deformation is corrected by feedback-controlling the electric currents applied to the superconducting shim coils 110 and 210 such that the magnetic field distribution measured by the magnetic field sensor 300 matches the ideal static magnetic field distribution stored in the memory.

The MRI apparatus 1 of the above-described embodiment (for example, FIG. 2 and FIG. 10) has a configuration in which two static magnetic field magnets 10 are provided to face each other, and the object is placed and imaged in the space between the two static magnetic field magnets 10.

Alternatively, the MRI apparatus 1 may be configured to include only one of the two static magnetic field magnets 10. For example, the static magnetic field magnet 10 above the table 80 can be removed from the configuration of the MRI apparatus 1 shown in FIG. 2 or FIG. 10. Even in such a configuration, each of the above-described technical effects can be obtained.

(Modification of Superconducting Magnet)

Figure 11:
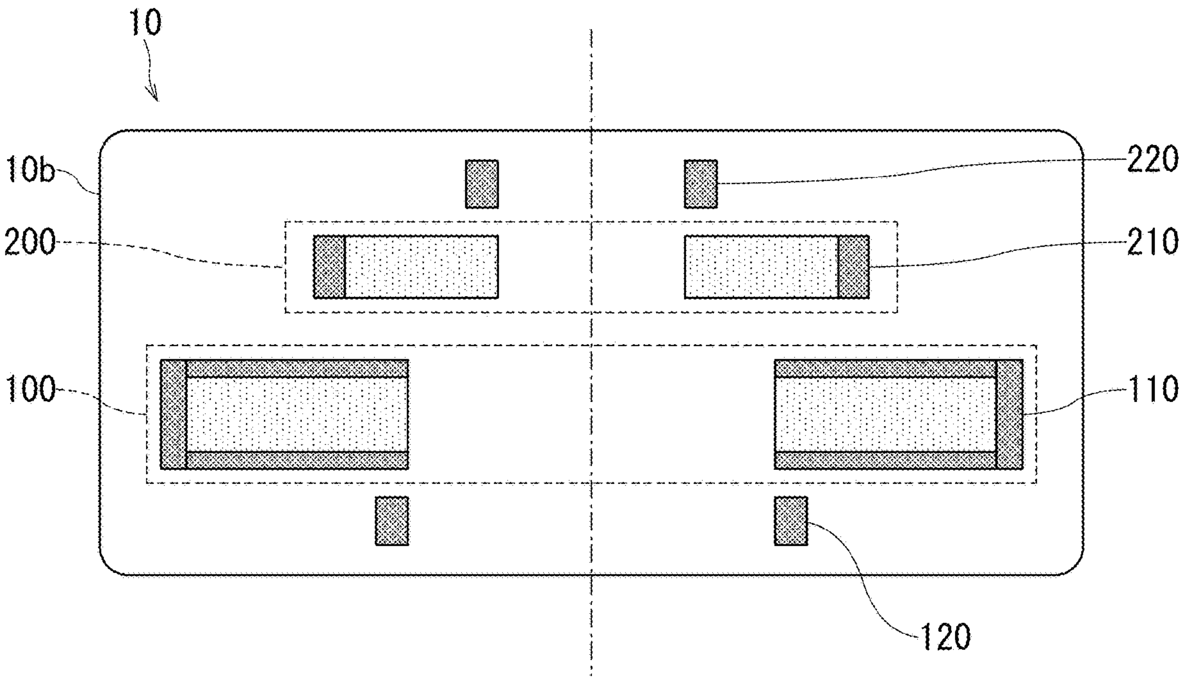
FIG. 11 is a schematic diagram illustrating a configuration of a modification of the superconducting magnet.

FIG. 11 shows a configuration of a modification of the superconducting magnet 10. The superconducting magnet 10 in each of the above-mentioned embodiments is configured to include at least one of a superconducting shim coil 110, which is arranged to cover part of or all of the outer surface of at least one primary superconducting coil 100, and a superconducting shim coil 210, which is arranged to cover part of or all of the outer peripheral surface of at least one secondary superconducting coil 200.

In contrast, in the modification of the superconducting magnet 10 shown in FIG. 11, a separate superconducting shim coil 120 or a separate superconducting shim coil 220 is provided in a position away from the primary superconducting coil 100 or the secondary superconducting coil 200, in addition to the superconducting shim coils 110, 210 described above.

In this way, by providing a separate superconducting shim coil 120 or a separate superconducting shim coil 220 in addition to the superconducting shim coils 110, 210 that are arranged to cover part of or all of the outer surface of the primary superconducting coil 100 and/or the secondary superconducting coil 200, it becomes possible to more finely correct the static magnetic field distribution generated by the primary superconducting coil 100 and the secondary superconducting coil 200.

According to at least one embodiment described above, disturbance in distribution of the static magnetic field generated by the superconducting magnet can be suppressed.

While certain embodiments have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A superconducting magnet comprising:

at least one primary superconducting coil configured to generate a primary magnetic field;

at least one secondary superconducting coil configured to generate a secondary magnetic field in a direction opposite to a direction of the primary magnetic field; and a superconducting shim coil configured to surround part or all of an outer surface of at least one of the at least one primary superconducting coil and the at least one secondary superconducting coil, and correct distribution of a static magnetic field generated by both the at least one primary superconducting coil and the at least one secondary superconducting coil.

2. The superconducting magnet according to claim 1, wherein each of the primary superconducting coil and the secondary superconducting coil is configured by winding a winding wire in such a manner that a plurality of cylindrical layers are formed along a direction parallel to a cylindrical axis from an innermost layer toward an outermost layer.

3. The superconducting magnet according to claim 1, wherein:

each of the primary superconducting coil and the secondary superconducting coil further includes a winding frame; and the superconducting shim coil is provided outside the winding frame.

4. The superconducting magnet according to claim 1, wherein:

each of the primary superconducting coil and the secondary superconducting coil further includes a winding frame; and the superconducting shim coil is provided inside the winding frame.

5. The superconducting magnet according to claim 1, further comprising:

a shim coil power supply configured to supply an electric current to the superconducting shim coil; and a magnetic field sensor configured to measure a magnetic field, wherein the shim coil power supply is configured to supply the electric current to the superconducting shim coil in such a manner that distribution of the static magnetic field generated by the primary superconducting coil and the secondary superconducting coil is corrected based on the magnetic field measured by the magnetic field sensor.

6. The superconducting magnet according to claim 1, wherein the superconducting shim coil is disposed in such a manner that the superconducting shim coil shares a central axis with the primary superconducting coil or the secondary superconducting coil.

7. An MRI apparatus comprising the superconducting magnet according to claim 1.

8. The superconducting magnet according to claim 2, wherein the superconducting shim coil is provided to be adjacent to the outermost layer in such a manner that the superconducting shim coil surrounds the outermost layer and a nearby surface of the outer surface of at least one of the primary superconducting coil and the secondary superconducting coil.

9. The superconducting magnet according to claim 5, further comprising a cooling container that has a columnar shape with two parallel planes or a cylindrical shape with a central cavity, and houses the primary superconducting coil, the secondary superconducting coil, and the superconducting shim coil, wherein the magnetic sensor is provided outside the columnar shape of the cooling container or is provided in the central cavity of the cylindrical shape of the cooling container.

10. The superconducting magnet according to claim 5, wherein the superconducting shim coil is constantly connected to the shim coil power supply and corrects the static magnetic field distribution by the electric current supplied from the shim coil power supply.

11. The superconducting magnet according to claim 5, further comprising a persistent current switch provided between the superconducting shim coil and the shim coil power supply, wherein the superconducting shim coil is configured to:

correct the static magnetic field distribution by the electric current supplied from the shim coil power supply via the persistent current switch before shifting to a persistent current mode; and then shift to the persistent current mode after turning off the persistent current switch.

12. The superconducting magnet according to claim 8, wherein the superconducting shim coil is provided adjacent to a surface perpendicular to the cylindrical axis in such a manner that the superconducting shim coil further surrounds a surface perpendicular to the cylindrical axis of the outer surface of at least one of the primary superconducting coil and the secondary superconducting coil.

* * * * *